(12) United States Patent
Liu et al.

(10) Patent No.: US 7,990,178 B2
(45) Date of Patent: Aug. 2, 2011

(54) DRIVING CIRCUIT WITH IMPEDENCE CALIBRATION

(75) Inventors: Chih-Min Liu, Grand Cayman (KY); Ping-Hung Yin, Grand Cayman (KY)

(73) Assignee: Himax Imaging, Inc., Grand Cayman (KY)

( * ) Notice: Subject to any disclaimer, the term of this patent is extended or adjusted under 35 U.S.C. 154(b) by 0 days.

(21) Appl. No.: 12/628,226

(22) Filed: Dec. 1, 2009

(65) Prior Publication Data
US 2011/0128036 A1 Jun. 2, 2011

(51) Int. Cl.
*H03K 19/094* (2006.01)
(52) U.S. Cl. .............................. 326/83; 326/86; 327/109
(58) Field of Classification Search .............. 326/82–83, 326/86; 327/108–109
See application file for complete search history.

(56) References Cited

U.S. PATENT DOCUMENTS

| | | | | |
|---|---|---|---|---|
| 4,918,336 | A * | 4/1990 | Graham et al. ............... | 326/117 |
| 5,977,796 | A * | 11/1999 | Gabara ........................... | 326/86 |
| 6,111,431 | A * | 8/2000 | Estrada ........................... | 326/83 |
| 6,356,141 | B1 * | 3/2002 | Yamauchi ..................... | 327/543 |
| 6,448,815 | B1 * | 9/2002 | Talbot et al. .................... | 326/86 |
| 6,590,422 | B1 * | 7/2003 | Dillon .............................. | 326/86 |
| 6,686,772 | B2 * | 2/2004 | Li et al. ............................ | 326/83 |
| 6,731,135 | B2 * | 5/2004 | Brunolli .......................... | 326/83 |
| 6,900,663 | B1 * | 5/2005 | Roper et al. .................... | 326/83 |
| 6,977,534 | B2 | 12/2005 | Radelinow | |
| 7,012,450 | B1 * | 3/2006 | Oner et al. ...................... | 326/86 |
| 7,248,079 | B2 * | 7/2007 | Bhattacharya et al. ......... | 326/83 |
| 7,382,160 | B2 * | 6/2008 | Nagano et al. .................. | 326/86 |
| 2001/0052796 | A1 * | 12/2001 | Tomita ............................ | 326/83 |
| 2003/0085736 | A1 * | 5/2003 | Tinsley et al. .................. | 326/81 |
| 2003/0193350 | A1 * | 10/2003 | Chow .............................. | 326/83 |
| 2004/0246025 | A1 * | 12/2004 | Tran et al. ....................... | 326/82 |
| 2004/0246026 | A1 * | 12/2004 | Wang et al. ..................... | 326/86 |
| 2005/0258869 | A1 * | 11/2005 | Sointula .......................... | 326/86 |
| 2007/0115034 | A1 | 5/2007 | Nguyen | |
| 2007/0241795 | A1 * | 10/2007 | Kwasniewski et al. ........ | 327/108 |
| 2008/0246511 | A1 * | 10/2008 | Miura et al. .................... | 326/83 |
| 2009/0180570 | A1 * | 7/2009 | Koh et al. ....................... | 375/295 |

* cited by examiner

*Primary Examiner* — Jason M Crawford
(74) *Attorney, Agent, or Firm* — Winston Hsu; Scott Margo

(57) ABSTRACT

A driving circuit includes at least a driving unit. The driving circuit includes a first bias component, a second bias component, and four metal-oxide-semiconductor (MOS) transistors. The first bias component has a first node coupled to a first reference voltage and a second node for outputting a first bias current. The second bias component has a first node for draining a second bias current and a second node coupled to a second reference voltage different from the first reference voltage. Each of the MOS transistors has a control node for receiving one of input signal pairs, a node coupled to one of the bias components and another node coupled to one of the output ports of the driving circuit. The four MOS transistors are of a same conductive type.

17 Claims, 6 Drawing Sheets

DRIVING CIRCUIT WITH IMPEDENCE CALIBRATION

BACKGROUND OF THE INVENTION

1. Field of the Invention

The present invention relates to a driver, and more particularly, to a low power, high speed driving circuit with auto-calibration functionality.

2. Description of the Prior Art

As the resolution of image sensors or display increases, the data rate of becomes very high. As a result, a requirement for a high speed driver with superior performance grows. Among all kinds of high speed drivers, a low voltage differential signal (LVDS) technique is frequently utilized due to a lower electromagnetic interference (EMI), a lower power consumption and a better signal integrity than those of a conventional CMOS full swing driver. Please refer to FIG. 1, which is a diagram of a conventional LVDS driver for driving a pair of loads $R_1$ and $R_2$. The conventional LVDS driver 100 is composed of two PMOS transistors $M_1$, $M_2$, two NMOS transistors $M_3$, $M_4$, and two constant current sources $I_1$ and $I_2$ connected to a reference supply voltage VDD and a reference ground GND, respectively, wherein each current source $I_1$, $I_2$ has a constant current I flowing through. The transistors $M_2$ and $M_4$ are connected to a first input voltage VIP of a differential signal pair through their gates and transistors $M_1$ and $M_3$ are connected to a second input voltage VIN of the differential signal pair through their gates. When the first input voltage VIP is high (which implies that the second input voltage VIN is low), the transistors $M_1$ and $M_4$ are switched on and the current I flows through the reference supply voltage VDD, the current source $I_1$, the transistor $M_1$, the loads $R_1$ and $R_2$, the transistor $M_4$, the current source $I_2$ and finally to the reference ground GND. Assuming a 1.25V common mode voltage is sustained at output node OP and the output node ON, and the loads $R_1$ and $R_2$ are both equivalently 50 ohms, the biasing current I can be derived as 2 mA for a typical output swing of ±0.2V at the output node OP and the output node ON.

As the data rate rises up to giga bits per second (Gbps) and cable length becomes longer, the impedance matching issue becomes crucial to prevent signal reflection at both the transmitter side and the receiver side. For the LVDS driver 100 shown in FIG. 1, the impedance matching means that the impedance towards each side of the output node OP (or the output node ON) should be conjugate with each other. Since the load $R_1$ driven by a signal traveling from the output node ON through a cable has a resistance of 50 ohms as well as a characteristic impedance of the cable, the impedance towards the opposite side against the load $R_1$ should also be 50 ohms to match the load $R_1$. However, for the LVDS driver 100 in FIG. 1, when the first input voltage VIP is high, the impedance towards the opposite side against the load $R_1$ is almost infinite (the connection to the transistor $M_3$ is open circuited and the connection to the transistor $M_1$ and the current source $I_1$ is also open circuited), and therefore the required matching is out of the question. Please refer to FIG. 2, which is a diagram of a conventional LVDS driver 200 with matching resistors R3 and R4 implemented therein. The conventional LVDS driver 200 is composed of two PMOS transistors $M_1$, $M_2$, two NMOS transistors $M_3$, $M_4$, and two constant current sources $I_1'$ and $I_2'$ connected to a reference supply voltage VDD and a reference ground GND, respectively, wherein each current source $I_1'$, $I_2'$ has a constant current $2*I$ flowing through. The matching resistors $R_3$ and $R_4$ are both designed as 50 ohms to match loads $R_1$ and $R_2$, respectively. For the LDVS driver 200 in FIG. 2, the impedance towards the opposite side against the load $R_1$ is the matching resistor $R_3$ and therefore a proper matching can be achieved. Nevertheless, this modified LVDS driver 200 accomplishes the proper matching at the expense of extra current flowing through the matching resistors $R_3$ and $R_4$, doubling the overall power consumption.

For some applications, the applied driver has to further fulfill some other specification requirements: for example, the Mobile Industry Processor Interface (MIPI) standard demands a very low supply voltage of 0.4V, and a common mode voltage of 0.2V while maintaining an output swing of ±0.1V. In this case, a tail current source connecting reference ground is impossible to be applied. Please refer to FIG. 3, which is a diagram of a conventional LVDS driver 300 for MIPI standard. The conventional LVDS driver 300 is composed of two PMOS transistors $M_1'$, $M_2'$, two resistors $R_3$, $R_4$ connected to a reference ground GND, and a constant current source $I_3'''$ connected to a reference supply voltage VDD, wherein the current source $I_3'''$ has a constant current $4*I'$ flowing through. When the first input voltage VIP is high, the current from the current source $I_3'''$ travels through the transistor M1 and then splits into two, one quarter of the current keeps driving the loads $R_1'$ and $R_2'$ and then travels toward the reference ground GND through the resistor $R_4'$; while the remaining current is conducted to the reference ground GND through the resistor $R_3'$. To fulfill the specification requirements of the MIPI standard, the current $4*I'$ sourced from the current source $I_3'''$ is equal to 8 mA, and each of the resistors $R_1'$, $R_2'$, $R_3'$ and $R_4'$ is 50 ohms to achieve proper matching. The LDVS driver 300 shown in FIG. 3 can successively meet the requirements of the MIPI standard but still suffers from an over-large power consumption (8 mA for one single driver).

SUMMARY OF THE INVENTION

To solve the abovementioned problems, an exemplary embodiment of the present invention therefore provides a novel driving circuit (e.g., a novel LDVS driver) capable of achieving the same performance with less power consumption.

An exemplary driving circuit of the present invention includes at least a driving unit having a first bias component, a second bias component, a first metal-oxide-semiconductor (MOS) transistor, a second MOS transistor, a third MOS transistor and a fourth MOS transistor. The first bias component has a first node coupled to a first reference voltage, and a second node for outputting a first bias current. The second bias component has a first node for draining a second bias current, and a second node coupled to a second reference voltage different from the first reference voltage. The first MOS transistor has a control node for receiving a first input signal, a first connection node coupled to the second node of the first bias component, and a second connection node coupled to a first output port of the driving circuit. The second MOS transistor has a control node for receiving a second input signal, a first connection node coupled to the second node of the first bias component, and a second connection node coupled to a second output port of the driving circuit. The third MOS transistor has a control node for receiving the second input signal, a first connection node coupled to the first output port of the driving circuit, and a second connection node coupled to the first node of the second bias component. The fourth MOS transistor has a control node for receiving the first input signal, a first connection node coupled to the second output port of the driving circuit, and a second connection node coupled to the first node of the second bias component. The first MOS transistor, the second MOS transistor, the third MOS transistor, and the fourth MOS transistor are a same conductive type.

These and other objectives of the present invention will no doubt become obvious to those of ordinary skill in the art after reading the following detailed description of the preferred embodiment that is illustrated in the various figures and drawings.

DETAILED DESCRIPTION

Figure 4:
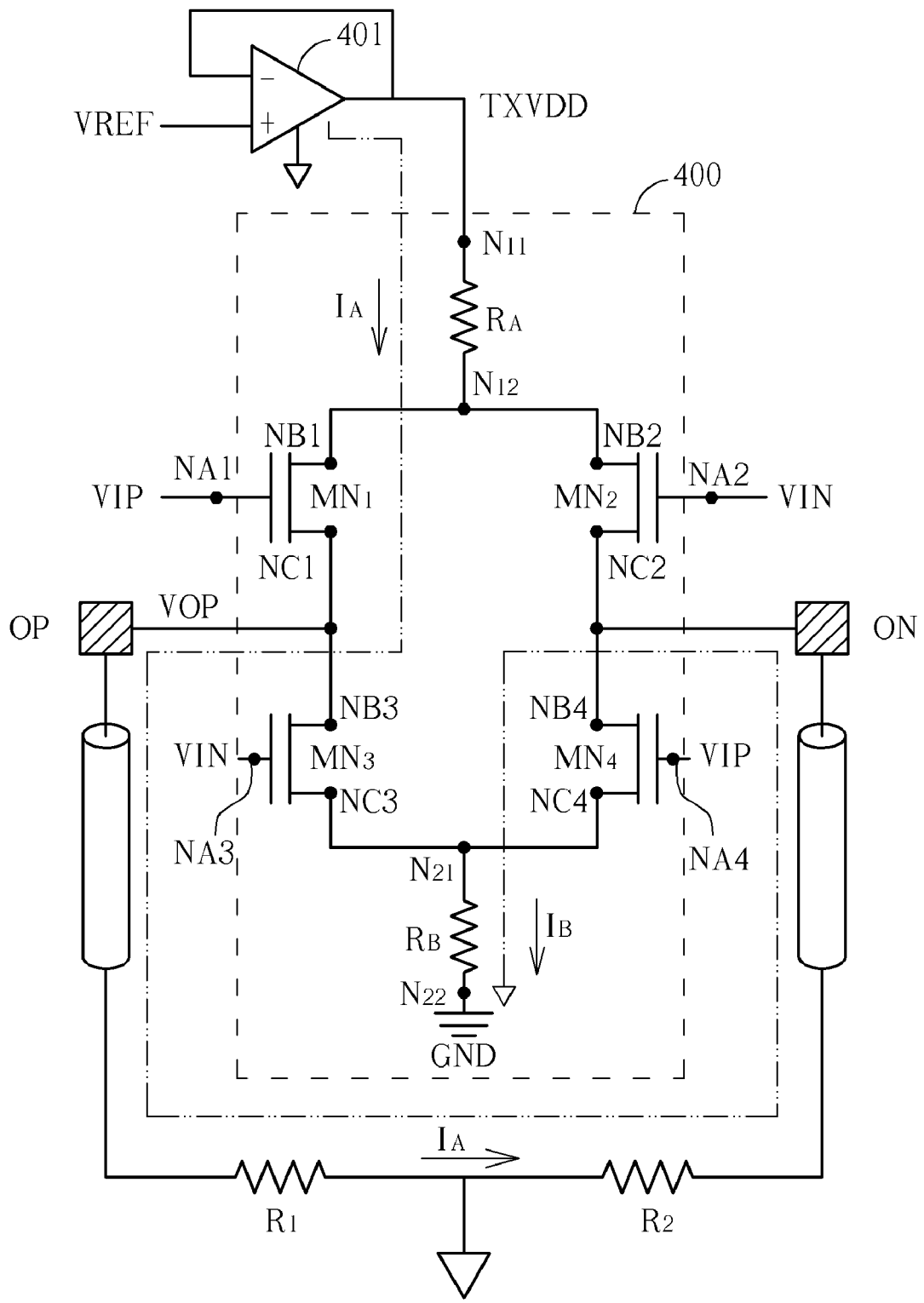
FIG. 4 is a diagram illustrating a driving unit (e.g., an LDVS driver) according to an embodiment of the present invention.

Please refer to FIG. 4, which shows a driving unit (e.g., an LDVS driver) according to an embodiment of the present invention. The exemplary driving unit 400 includes, but is not limited to, a first bias component $R_A$, a second bias component $R_e$, a first metal-oxide-semiconductor (MOS) transistor $MN_1$, a second MOS transistor $MN_2$, a third MOS transistor $MN_3$, and a fourth MOS transistor $MN_4$, where the first, second, third, and fourth MOS transistors $MN_1$-$MN_4$ have the same conductive type. By way of example, rather than limitation, the first and second bias components $R_A$ and $R_B$ are implemented using resistors, and the first, second, third, and fourth MOS transistors are N-channel metal-oxide-silicon (NMOS) transistors for a lower threshold voltage. However, this is for illustrative purposes only. Any driving circuit that follows the exemplary circuit architecture shown in FIG. 4 to configure interconnections of implemented bias components and MOS transistors falls within the scope of the present invention.

The first bias components $R_A$ has a first node N11 coupled to a first reference voltage TXVDD and a second node N12 for outputting a first bias current $I_A$. The second bias component $R_B$ has a first node N21 for draining a second bias current $I_B$ (which is identical to the first bias current $I_A$ in this exemplary embodiment) and a second node N33 coupled to a second reference voltage GND different from the first reference voltage TXVDD. The first MOS transistor $MN_1$ has a control node NA1 for receiving a first input signal (e.g., a first input signal VIP of a differential signal pair), a first connection node NB1 coupled to the second node N12 of the first bias component $R_A$, and a second connection node NC1 coupled to a first output port of the driving unit (e.g., an output node OP). The second MOS transistor $MN_2$ has a control node NA2 for receiving a second input signal (e.g., a second input signal VIN of the differential signal pair), a first connection node NB2 coupled to the second node N12 of the first bias component $R_A$, and a second connection node NC2 coupled to a second output port of the driving unit (e.g., an output node ON). The third MOS transistor $MN_3$ has a control node NA3 for receiving the second input signal (e.g., VIN), a first connection node NB3 coupled to the first output port of the driving unit (e.g., the output node OP), and a second connection node NC3 coupled to the first node N21 of the second bias component $R_B$. The fourth MOS transistor $MN_4$ has a control node NA4 for receiving the first input signal (e.g., VIP), a first connection node NB4 coupled to the second output port of the driving unit (e.g., the output node ON), and a second connection node NC4 coupled to the first node N21 of the second bias component RB.

Figure 1:
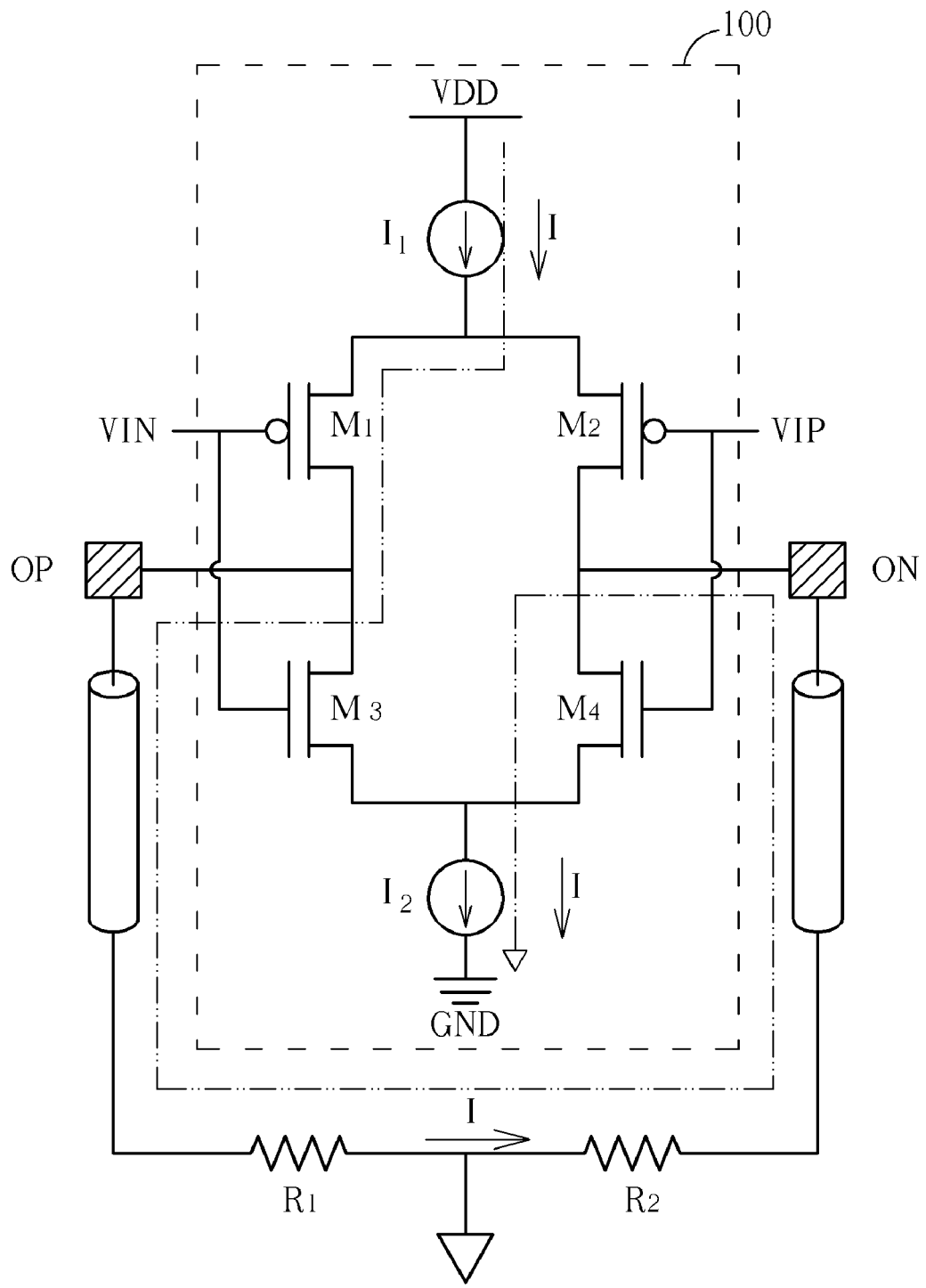
FIG. 1 is a diagram illustrating a conventional LVDS driver for driving loads.
Figure 2:
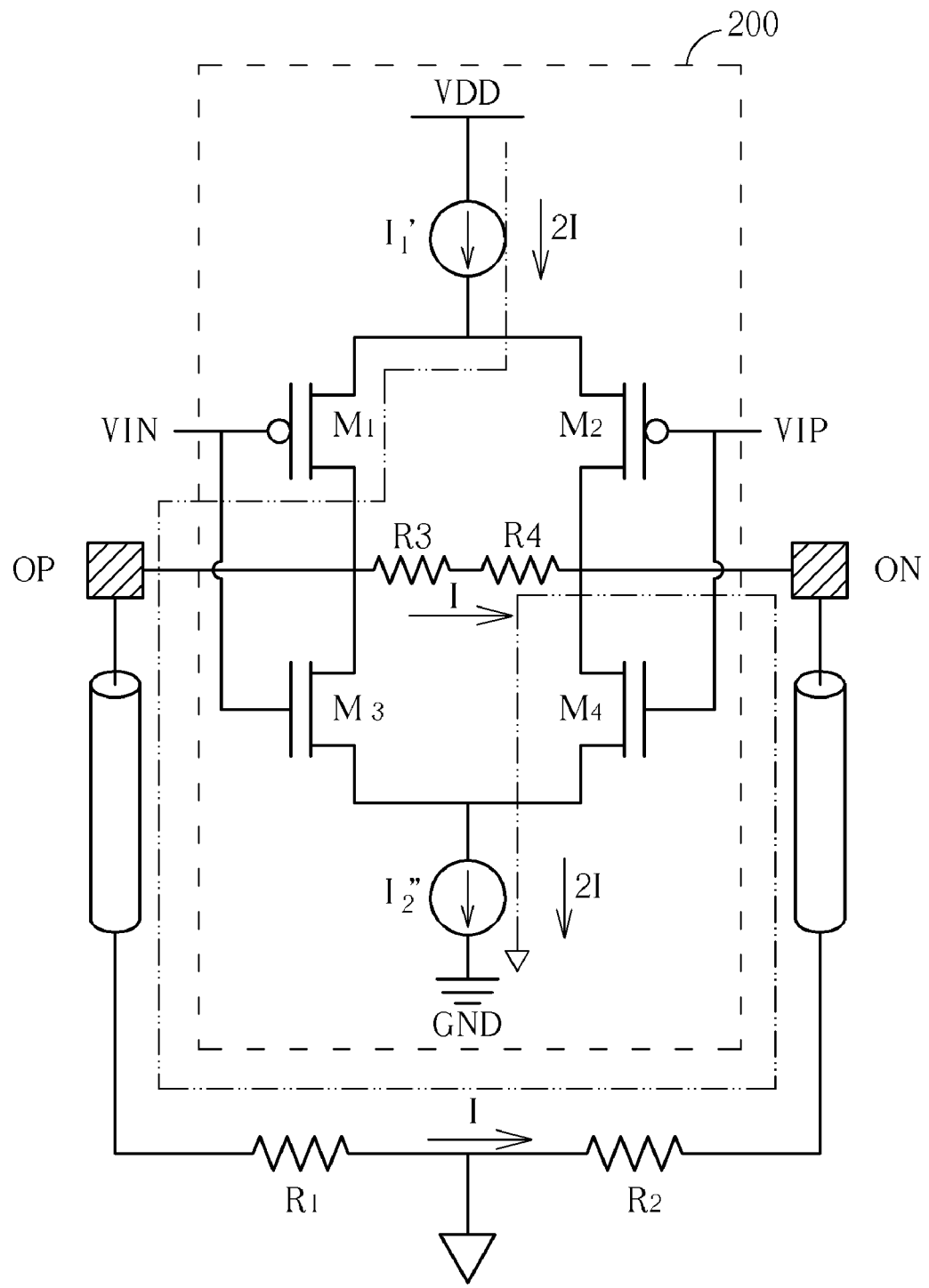
FIG. 2 is a diagram illustrating a conventional LVDS driver with matching resistors implemented therein.
Figure 3:
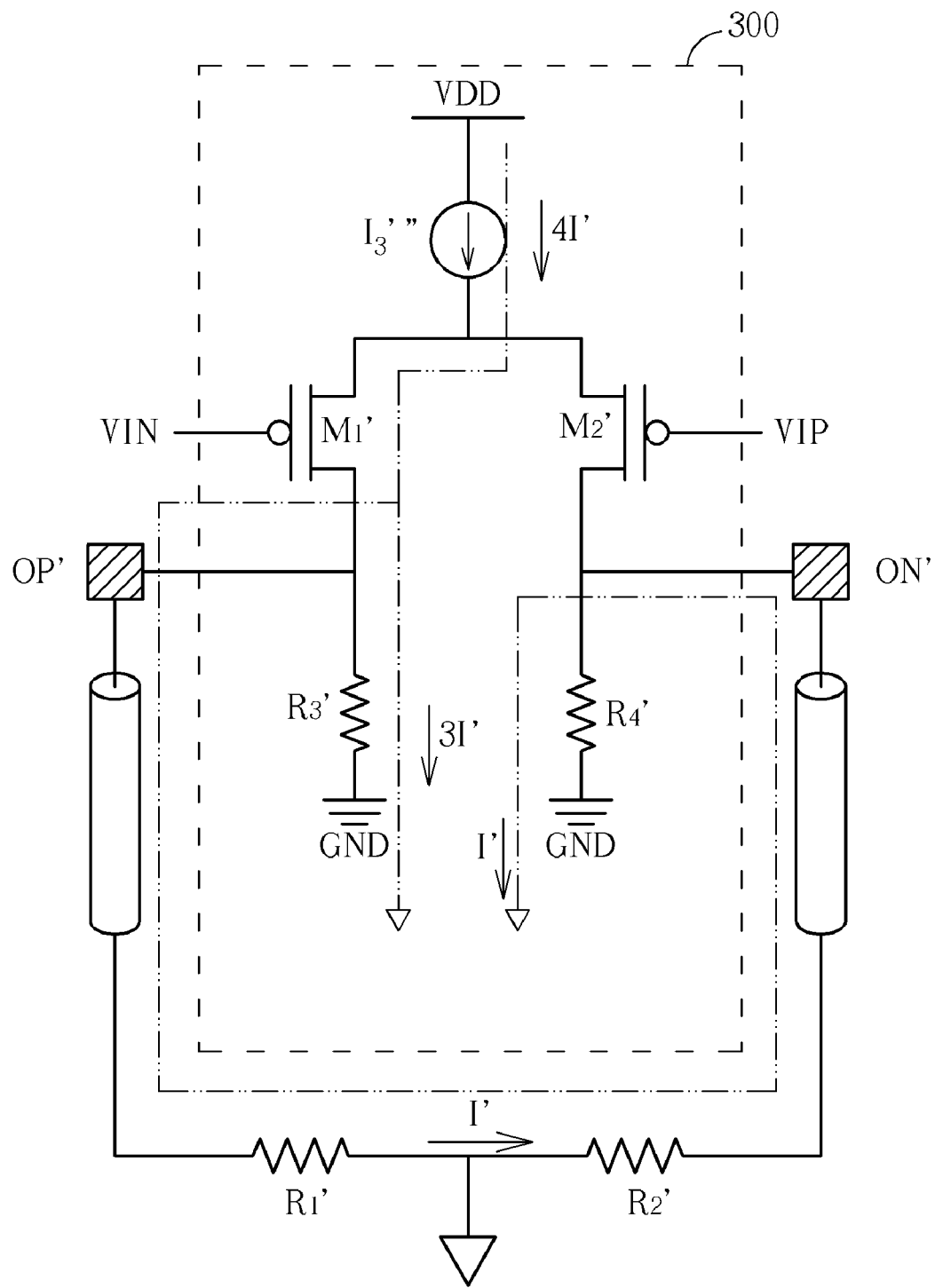
FIG. 3 is a diagram illustrating a modified LVDS driver for the MIPI standard.

As can be seen from the diagram, the gates of the first and fourth MOS transistors (NMOS transistors) $MN_1$ and $MN_4$ are connected to a first input signal VIP of a differential signal pair; and the gates of the second and third MOS transistors (NMOS transistors) $MN_2$ and $MN_3$ are connected to a second input signal VIN of the differential signal pair. A clean and stable supply voltage TXVDD is provided via a buffer 401 with a bandgap reference voltage VREF. The first and second MOS transistors (NMOS transistors) $MN_1$ and $MN_2$ are connected to the supply voltage TXVDD via the first bias component (e.g., a resistor) $R_A$ in this embodiment; while the third and fourth MOS transistors (NMOS transistors) $MN_3$ and $MN_4$ are connected to a reference ground GND via the second bias component (e.g., a resistor) $R_B$ in this embodiment. When the first input signal VIP is high (which implies that the second input voltage VIN is low), the first current $I_A$ is conducted from the supply voltage TXVDD, flowing through the first bias component $R_A$, the first MOS transistor $MN_1$, the loads $R_1$ and $R_2$, the fourth MOS transistor $MN_4$ and finally through the second bias component RB to the reference ground GND. Considering the impedance matching issue, to match the impedance of the load $R_1$ at one side of the output node OP, an impedance towards the other side of the output node OP should be equal to the impedance of the load $R_1$, namely, an on-resistance in series with the first bias component $R_A$ which is a resistor in this exemplary embodiment. Likewise, a proper matching at the output node ON can also be derived by adjusting the second bias component $R_B$ which is a resistor in this exemplary embodiment. Considering the MIPI standard, the supply voltage should be 0.4V whereas the loads $R_1$ and $R_2$ are both 50 ohms, the resistance of the first and second bias components RA and RB are 50 ohms minus on-resistance of the first MOS transistor $MN_1$ and 50 ohms minus on-resistance of the MOS transistor $MN_4$, respectively. In an ideal case, the on-resistances of the MOS transistors are zero, and thereby the resistances of the first and second bias components (e.g., resistors) $R_A$ and $R_B$ are both 50 ohms. Therefore, in accordance with an exemplary embodiment of the present invention, a driving unit (i.e., a driver) consuming only 2 mA without sacrificing any operation performance is proposed. Compared with the conventional LDVS driver 300 in FIG. 3, each single driver implemented using the proposed driving unit architecture can save 6 mA, and since the MIPI standard requires five drivers, a total current of 30 mA can be saved according to the present invention.

Figure 5:
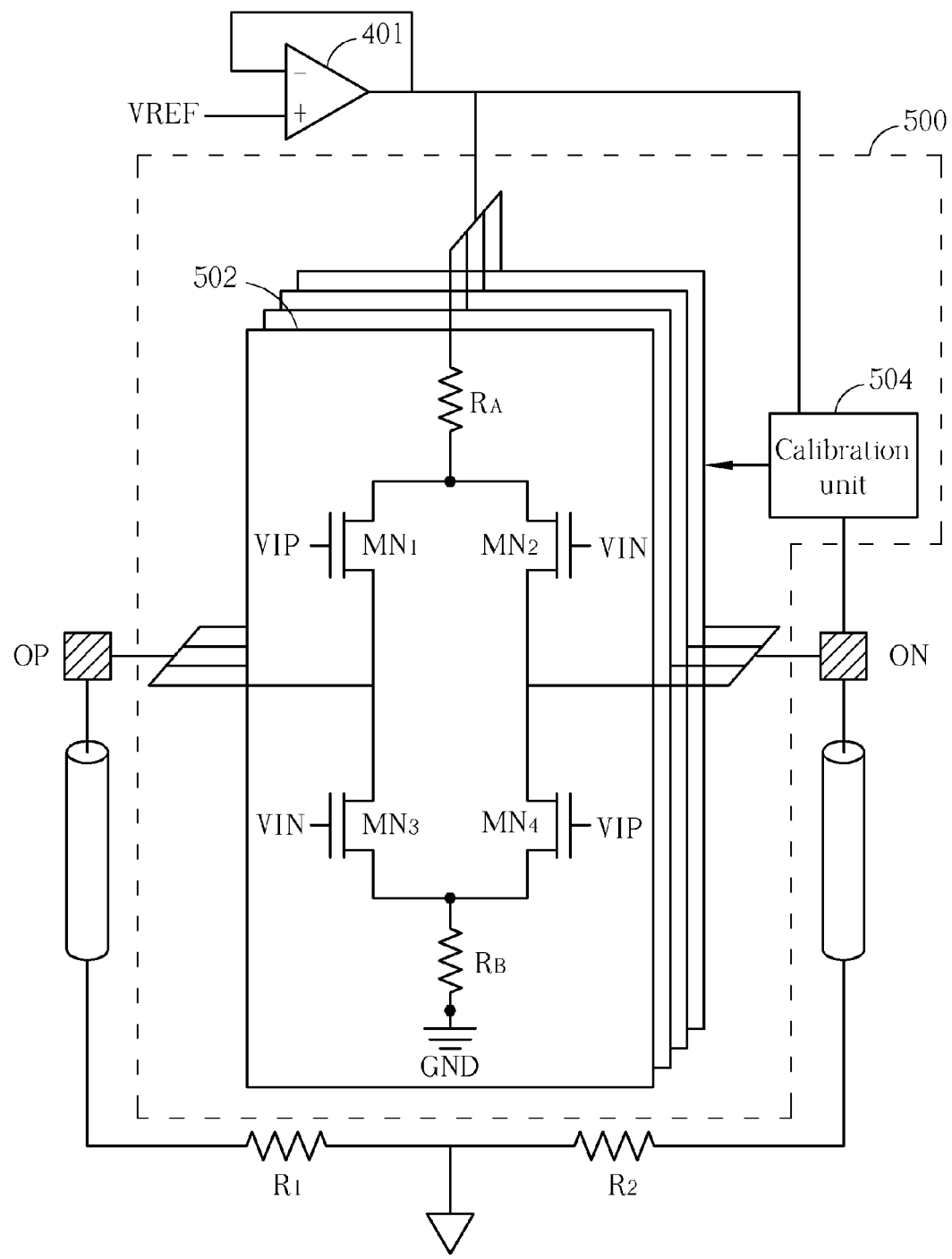
FIG. 5 is a driving circuit with impedance calibration functionality according to an embodiment of the present invention.
Figure 6:
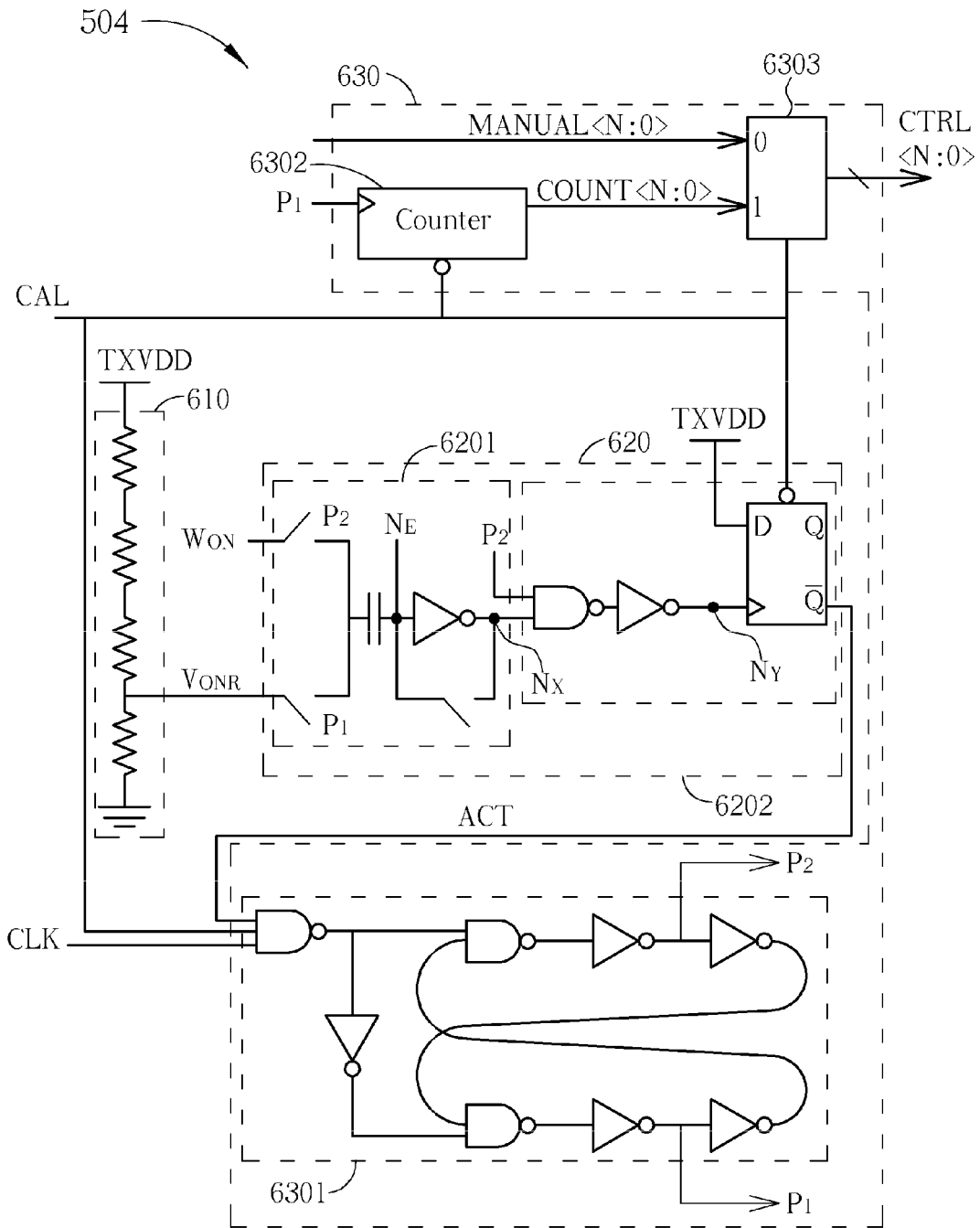
FIG. 6 is an embodiment of a calibration unit in FIG. 5 according to the present invention.

Due to the process variation, on-chip resistors usually suffer from a 30% variation and cannot achieve a proper matching. Therefore, in order to calibrate the output impedances to be substantially 50 ohms, a conventional driver adopts a current mirror pair and an additional pin connecting to a more accurate external resistor for calibration. However, an additional pin and an external resistor imply an extra cost and are therefore not favorable for commercial consideration. Please refer to FIG. 5, which is a driving circuit with impedance calibration functionality according to an embodiment of the present invention. The driving circuit 500 in FIG. 5 includes, but is not limited to, a plurality of driving units 502 each having a circuit architecture identical to that of the exemplary driving unit 400 shown in FIG. 4) and a calibration unit 504, wherein all of the driving units 502 are connected between the output nodes OP and ON of the driving circuit 500. For simplicity, only four driving units are shown in FIG. 5; however, this is for illustrative purposes only, and the total number of the implemented driving units depends upon actual design requirements. In this exemplary embodiment, the calibration unit 504 determines how many driving units 502 would be activated according to a voltage swing on an output node of the driving circuit 500 (e.g., the output node ON). Please refer to FIG. 6, which is an embodiment of the calibration unit 504 shown in FIG. 5 according to the present invention. As shown in the figure, the calibration unit 504 includes a target voltage generator 610, a comparator 620 and a control logic 630. The target voltage generator 610 includes four identical resistors, which are fabricated on chip and connected in series, for voltage dividing purpose.

Please refer to FIG. 4 again. Assuming all MOS transistors have zero on-resistance when conducting, while the input voltage VIP is high, the signal travels through four resistors (i.e., the first bias component $R_A$, loads R1 and R2, and the second bias component RB), and the resistances of the four resistors are the same (e.g., 50 ohms) due to the impedance matching consideration, and therefore the output voltage VOP is three-quarters of the supply voltage TXVDD and the output voltage VON is one-quarter of the supply voltage TXVDD, i.e., VOP:VON=3:1. When a process variation occurs, the resistances of the first and second bias components $R_A$ and $R_B$ may not be close to 50 ohms, and the eventual outcome of output voltages VOP and VOP at output nodes NP and ON, respectively, will not be able to maintain a desired 3:1 ratio, leading to a poor impedance matching and a poor signal integrity. With the help of the target voltage generator 610, the output voltage VON can be properly adjusted according to a target voltage VONR generated from a voltage dividing architecture implemented in the target voltage generator 610 shown in FIG. 6. Since the target voltage VONR is derived by a resistor ratio rather than exact resistance values, the process variation can be substantially suppressed.

The comparator 620 compares a voltage level of the output voltage VON and the target voltage VONR according to two clock signals P1 and P2, which are generated from the control logic 630, and thereby generates a comparison output ACT. In this embodiment, the comparator 620 includes a sampling and adjusting element 6201 and a determining element 6202. The sampling and adjusting element 6201 samples the target voltage VONR to generate a sampled voltage at an output node Nx according to the clock signal P1, and thereby adjusts the sampled voltage according to a difference between the target voltage VONR and the output signal VON to generate an adjusted voltage at the output node Nx. The determining element 6202 generates the comparison output ACT according to a voltage level at the output node Nx of the sampling and adjusting element 6201. The control logic 630 generates a control signal CTRL<N:0> to control the number of driving units to be activated according to the comparison output ACT.

An operation of the calibration unit 504 is detailed as follows. First of all, only one driving unit is activated, a calibration signal CAL is enabled and activates a clock generator 6301 within the control logic 630, and the clock generator 6301 generates two out-of-phase clock signals P1 and P2 according to a reference clock signal CLK. That is, the clock signal P2 is an inverse version of the clock signal P1. When the clock signal P1 is high (which implies that the clock signal P2 is low), the voltage level of the target voltage VONR is stored at Nx whereas a voltage level at Ny is fixed as low. When the clock signal P1 goes low (i.e., the clock signal P2 is high), the voltage level of the output voltage VON is introduced; if the output voltage VON is higher than the target voltage VONR, the voltage level at Nz is enhanced by an amount equal to a difference between VON and VONR, and the voltage level at Nx is thereby low and the voltage level at Ny is kept low; if the output voltage VON is lower than the target voltage VONR, the voltage level at Nz is lowered by an amount equal to a difference between VON and VONR, and the voltage level at Nx is thereby high and the voltage level at Ny turns out to be high and triggers a following D flip-flop and activates the comparison output ACT to stop the clock generator 6301.

When the clock generator 6301 starts outputting clock signals P1 and P2, the clock signal P1 is transmitted to a counter 6302 within the control logic 630 to count accordingly until the comparison output ACT stops the clock generator 6301. A control signal generator 6303, which is a multiplexer in this embodiment, receives counting signals COUNT<N:0> from the counter 6302 and determines to output the counting signals COUNT<N:0> or manually-set signals MANUAL<N:0> as the control signal CTRL<N:0>. Please note that the embodiment above is only for illustrative purposes and is not supposed to be a limitation to the present invention. For example, the driving units 502 within the driving circuit 500 can utilize a thermometer-code method to distribute the output impedances of the driving units 502 in a binary fashion, and the control signal generator 6303 converts the counting signals COUNT<N:0> into a binary-type control signal to control the number of the driving units to be enabled.

To summarize, the exemplary driving circuit 600 of the present invention activates only one driving unit in the beginning, which implies a relatively large voltage level at the output node ON, the clock generator 6301 starts generating clock signals P1 and P2, and the counter 6302 also starts counting up according to clock cycles of the clock signal P1 such that the control signal generator 6303 outputs the control signal to activate more driving units 502 within the driving circuit 500. The more driving units 502 are activated, the smaller is the output impedance at the output node ON (since more output impedances of the driving units are connected in parallel), leading to a voltage drop of the output voltage VON at the output node ON. Once the output voltage VON is lower than the target voltage VONR, the comparator 620 enables a comparison output ACT to stop the clock generator 630, and the counter 6302 also stops counting. In this way, the number of the driving units needed to be enabled is determined.

In accordance with exemplary embodiments of the present invention, a driving circuit suitable for lower power and high-speed operation is provided. Adopting NMOS type transistors provides lower threshold voltage as well as lower power requirement, and the utilization of resistors as bias components provides proper matching with loads to be driven. Additionally, with the help of a simple on-chip calibration unit, no excessive cost is spent on additional pin and external resistors.

Those skilled in the art will readily observe that numerous modifications and alterations of the device and method may be made while retaining the teachings of the invention.

What is claimed is:

1. A driving circuit, comprising:
    a plurality of driving units each coupled between a first reference voltage and a second reference voltage, each driving unit comprising:
    a first bias component, having a first node coupled to the first reference voltage, and a second node for outputting a first bias current;

a second bias component, having a first node for draining a second bias current, and a second node coupled to the second reference voltage different from the first reference voltage;

a first metal-oxide-semiconductor (MOS) transistor, having a control node for receiving a first input signal, a first connection node coupled to the second node of the first bias component, and a second connection node coupled to a first output port of the driving circuit;

a second MOS transistor, having a control node for receiving a second input signal, a first connection node coupled to the second node of the first bias component, and a second connection node coupled to a second output port of the driving circuit;

a third MOS transistor, having a control node for receiving the second input signal, a first connection node coupled to the first output port of the driving circuit, and a second connection node coupled to the first node of the second bias component; and a fourth MOS transistor, having a control node for receiving the first input signal, a first connection node coupled to the second output port of the driving circuit, and a second connection node coupled to the first node of the second bias component;

wherein the first MOS transistor, the second MOS transistor, the third MOS transistor, and the fourth MOS transistor are of a same conductive type;

wherein the first output port is connected to a first cable having a first impedance matched with an impedance of the first bias component, and matched with an impedance of the second bias component;

wherein the second output port is connected to a second cable having a second impedance matched with the impedance of the first bias component, and matched with the impedance of the second bias component; and a calibration unit, coupled to the driving units, for activating at least one of the driving units according to an output signal of one of the first output port and the second port of the driving circuit.

2. The driving circuit of claim 1, wherein each of the first MOS transistor, the second MOS transistor, the third MOS transistor, and the fourth MOS transistor is an N-channel MOS (NMOS) transistor.

3. The driving circuit of claim 1, wherein the first input signal and the second input signal are a differential signal pair.

4. The driving circuit of claim 1, wherein at lest one of the first bias component and the second bias component is a resistor, which is matched with the first impedance of the first cable and matched with the second impedance of the second cable.

5. The driving circuit of claim 4, wherein the first bias component and the second bias component are combined to match an impedance of a loading coupled to the first output port or the second output port of the driving circuit.

6. The driving circuit of claim 1, wherein the calibration unit comprises:
a target voltage generator, for generating a target voltage;
a comparator, coupled to the target voltage generator and one of the first output port and the second port of the driving circuit, for comparing a voltage level of the output signal with the target voltage to generating a comparison output; and
a control logic, coupled to the comparator, for generating a control signal to control a number of activated driving units according to the comparison output.

7. The driving circuit of claim 6, wherein the target voltage is set according to at least an impedance of each load driven by the driving circuit and impedances of the first bias component and the second bias component.

8. The driving circuit of claim 6, wherein the control logic comprises:
a clock generator, for generating at least a first clock signal according to a reference clock, wherein when the voltage level of the output signal is substantially equal to the target voltage, the comparison output generated from the comparator stops the clock generator from generating the first clock signal; and
a counter, coupled to the clock generating, for generating a counter value according to the first clock signal, wherein the control signal is derived from the counter value.

9. The driving circuit of claim 6, wherein the control logic comprises:
a control signal generator, coupled to the counter, for converting the counter value into the control signal.

10. The driving circuit of claim 6, wherein the clock generator further generates a second clock signal according to the reference clock, where the first clock signal and the second clock signal are 180 degrees out of phase; and the comparator comprises:
a sampling and adjusting element, for sampling the target voltage to generate a sampled voltage at an output node according to the first clock signal, and for adjusting the sampled voltage according to a difference between the target voltage and the voltage level of the output signal to thereby generate an adjusted voltage; and
a determining element, coupled to the sampling and adjusting element, for generating the comparison output according to a voltage level at the output node of the sampling and adjusting element.

11. The driving circuit of claim 1, wherein the first reference voltage and the second voltage reference comply with a Mobile Processor Interface (MIPI) standard.

12. A driving circuit, comprising:
a plurality of driving units each coupled between a first reference voltage and a second reference voltage different from the first reference voltage, each driving unit comprising:
a first bias component, having a first node coupled to the first reference voltage, and a second node for outputting a first bias current;
a second bias component, having a first node for draining a second bias current, and a second node coupled to the second reference voltage;
a first metal-oxide-semiconductor (MOS) transistor, having a control node for receiving a first input signal, a first connection node coupled to the second node of the first bias component, and a second connection node coupled to a first output port of the driving circuit;
a second MOS transistor, having a control node for receiving a second input signal, a first connection node coupled to the second node of the first bias component, and a second connection node coupled to a second output port of the driving circuit;
a third MOS transistor, having a control node for receiving the second input signal, a first connection node coupled to the first output port of the driving circuit, and a second connection node coupled to the first node of the second bias component; and
a fourth MOS transistor, having a control node for receiving the first input signal, a first connection node coupled to the second output port of the driving circuit, and a second connection node coupled to the first node of the second bias component;

wherein the first MOS transistor, the second MOS transistor, the third MOS transistor, and the fourth MOS transistor are of a same conductivetype; and a calibration unit, coupled to the driving units, for activating at least one of the driving units according to an output signal of one of the first output port and the second port of the driving circuit.

13. The driving circuit of claim 12, wherein the calibration unit comprises:

a target voltage generator, for generating a target voltage;

a comparator, coupled to the target voltage generator and one of the first output port and the second port of the driving circuit, for comparing a voltage level of the output signal with the target voltage to generating a comparison output; and a control logic, coupled to the comparator, for generating a control signal to control a number of activated driving units according to the comparison output.

14. The driving circuit of claim 13, wherein the target voltage is set according to at least an impedance of each load driven by the driving circuit and impedances of the first bias component and the second bias component.

15. The driving circuit of claim 13, wherein the control logic comprises:

a clock generator, for generating at least a first clock signal according to a reference clock, wherein when the voltage level of the output signal is substantially equal to the target voltage, the comparison output generated from the comparator stops the clock generator from generating the first clock signal; and a counter, coupled to the clock generating, for generating a counter value according to the first clock signal, wherein the control signal is derived from the counter value.

16. The driving circuit of claim 13, wherein the control logic comprises:

a control signal generator, coupled to the counter, for converting the counter value into the control signal.

17. The driving circuit of claim 13, wherein the clock generator further generates a second clock signal according to the reference clock, where the first clock signal and the second clock signal are 180 degrees out of phase; and the comparator comprises:

a sampling and adjusting element, for sampling the target voltage to generate a sampled voltage at an output node according to the first clock signal, and for adjusting the sampled voltage according to a difference between the target voltage and the voltage level of the output signal to thereby generate an adjusted voltage; and a determining element, coupled to the sampling and adjusting element, for generating the comparison output according to a voltage level at the output node of the sampling and adjusting element.

* * * * *